United States Patent
Hwang et al.

(10) Patent No.: US 8,987,872 B2
(45) Date of Patent: Mar. 24, 2015

(54) ELECTROMAGNETIC INTERFERENCE ENCLOSURE FOR RADIO FREQUENCY MULTI-CHIP INTEGRATED CIRCUIT PACKAGES

(71) Applicant: QUALCOMM Incorporated, San Diego, CA (US)

(72) Inventors: Kyu-Pyung Hwang, San Diego, CA (US); Young Kyu Song, San Diego, CA (US); Dong Wook Kim, San Diego, CA (US); Changhan Hobie Yun, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/794,487

(22) Filed: Mar. 11, 2013

(65) Prior Publication Data

US 2014/0252568 A1    Sep. 11, 2014

(51) Int. Cl.
*H01L 23/552*    (2006.01)
*H01L 21/82*    (2006.01)
(Continued)

(52) U.S. Cl.
CPC .............. *H01L 23/552* (2013.01); *H01L 21/82* (2013.01); *H01L 25/0652* (2013.01); *H05K 9/0007* (2013.01); *H01L 2225/06537* (2013.01); *H01L 23/66* (2013.01); *H01L 2225/06517* (2013.01); *H01L 24/13* (2013.01); *H01L 24/16* (2013.01); *H01L 24/17* (2013.01); *H01L 24/48* (2013.01); *H01L 2224/131* (2013.01); *H01L 2224/16225* (2013.01); *H01L 2224/16235* (2013.01); *H01L 2224/16245* (2013.01);
(Continued)

(58) Field of Classification Search
USPC .................................. 257/659, 660; 361/816
See application file for complete search history.

(56) References Cited

U.S. PATENT DOCUMENTS

| 7,071,556 | B2 | 7/2006 | Mu |
| 7,514,774 | B2 | 4/2009 | Leung et al. |

(Continued)

FOREIGN PATENT DOCUMENTS

| EP | 1657749 A2 | 5/2006 |
| EP | 1818979 A1 | 8/2007 |

(Continued)

OTHER PUBLICATIONS

International Search Report and Written Opinion—PCT/US2014/021078—ISA/EPO—May 12, 2014.

*Primary Examiner* — Errol Fernandes
(74) *Attorney, Agent, or Firm* — Loza & Loza, LLP (57) ABSTRACT

One feature pertains to a multi-chip package that includes a substrate and an electromagnetic interference (EMI) shield coupled to the substrate. At least one integrated circuit is coupled to a first surface of the substrate. The EMI shield includes a metal casing configured to shield the package from radio frequency radiation, a dielectric layer coupled to at least a portion of an inner surface of the metal casing, and a plurality of signal lines. The signal lines are coupled to the dielectric layer and electrically isolated from the metal casing by the dielectric layer. At least one other integrated circuit is coupled to an inner surface of the EMI shield, and at least a portion of the inner surface of the EMI shield faces the first surface of the substrate. The signal lines are configured to provide electrical signals to the second circuit component.

26 Claims, 11 Drawing Sheets

(51) Int. Cl.
*H01L 25/065* (2006.01)
*H05K 9/00* (2006.01)
*H01L 23/66* (2006.01)
*H01L 23/00* (2006.01)

(52) U.S. Cl.
CPC ............... *H01L 2224/17515* (2013.01); *H01L 2224/48227* (2013.01); *H01L 2924/14* (2013.01); *H01L 2924/15192* (2013.01); *H01L 2924/15311* (2013.01); *H01L 2924/19041* (2013.01); *H01L 2924/19042* (2013.01); *H01L 2924/19043* (2013.01); *H01L 2924/19105* (2013.01)
USPC ........................... 257/659; 257/660; 361/816

(56) References Cited

U.S. PATENT DOCUMENTS

| | | | |
|---|---|---|---|
| 7,709,915 B2 | 5/2010 | Morrison | |
| 2009/0260872 A1 | 10/2009 | Chen | |
| 2011/0049685 A1 | 3/2011 | Park et al. | |
| 2011/0298101 A1 | 12/2011 | Pagaila et al. | |
| 2012/0147571 A1* | 6/2012 | Just et al. | 361/750 |
| 2012/0228751 A1 | 9/2012 | Song | |

FOREIGN PATENT DOCUMENTS

| | | | |
|---|---|---|---|
| JP | H1197820 A | 4/1999 | |
| JP | 5247461 B2 | 7/2013 | |
| WO | WO-2008059643 A1 | 5/2008 | |

\* cited by examiner

United States Patent US 8,987,872 B2

ELECTROMAGNETIC INTERFERENCE ENCLOSURE FOR RADIO FREQUENCY MULTI-CHIP INTEGRATED CIRCUIT PACKAGES

BACKGROUND

1. Field

Various features relate to methods of electromagnetic interference (EMI) enclosures, and in particular to EMI enclosures for package on package (PoP) radio frequency (RF) integrated circuit devices.

2. Background

Package on package (PoP) is an integrated circuit packaging method that combines vertically discrete logic and memory ball grid array (BGA) packages into one unit. Two or more packages are installed atop each other (i.e. stacked) with a standard interface to route signals between them. This allows higher component density in devices, such as mobile phones, laptop computers, and digital cameras.

PoPs that contain radio frequency (RF) components, such as RF amplifiers and other RF active and/or passive components (e.g., filters, duplexers, etc.) may require electromagnetic interference (EMI) shielding (also commonly referred to as RF shielding) in order to isolate the RF components from the surrounding environment. This shielding prevents the PoP's RF components from leaking out RF energy to the surrounding environment, and also prevents unwanted, extraneous RF signal noise of the environment from being injected into the RF PoP.

Figure 1:
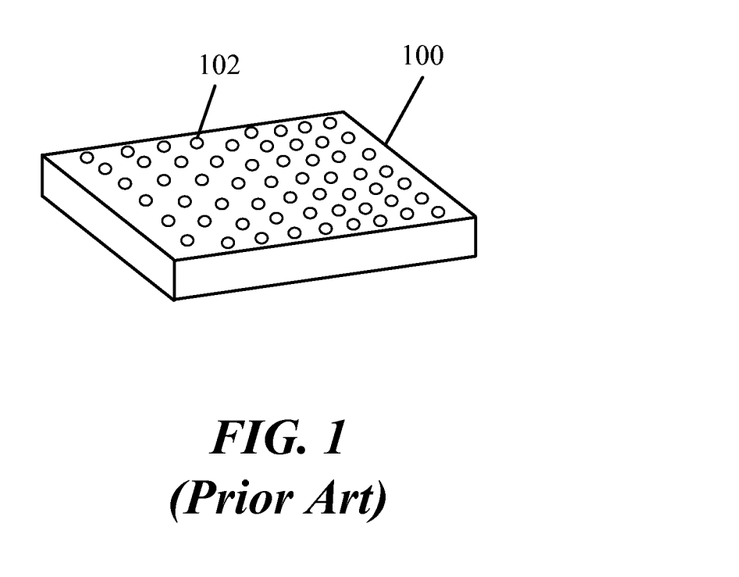
FIGS. 1 and 2 illustrate an EMI shield found in the prior art.
Figure 2:
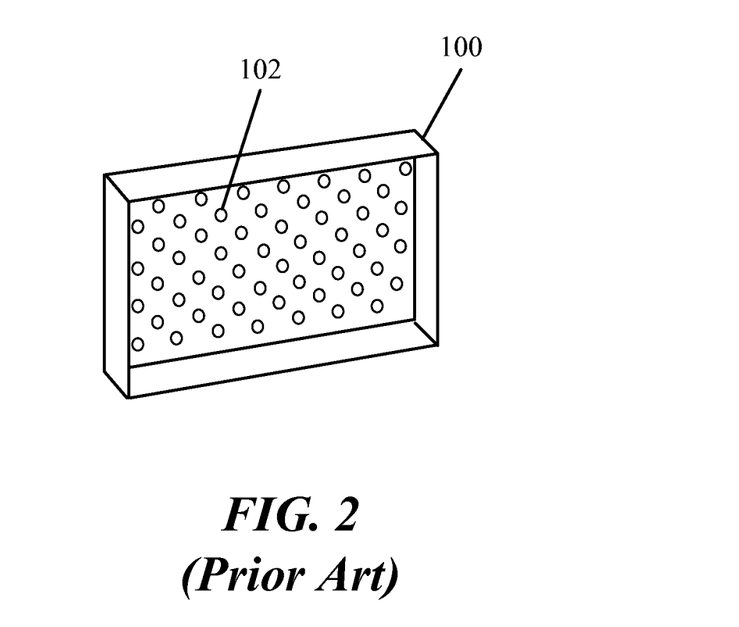

FIGS. 1 and 2 illustrate an EMI shield 100 found in the prior art. Specifically, FIG. 1 illustrates a top perspective view of the EMI shield 100, and FIG. 2 illustrates a bottom perspective view of the shield 100. The EMI shield 100 is typically made of a metal, such as aluminum, copper, etc. The shield 100 is sized to fit over one or more RF integrated circuits, such as RF PoP circuits. Once in place the shield 100 acts as a Faraday cage and insulates the RF circuitry within from RF radiation leaking into or out of the protected circuitry. The EMI shield 100 may feature a plurality of holes 102 that are sized small enough to still block RF radiation that has wavelengths significantly larger than the diameter of the holes.

Figure 3:
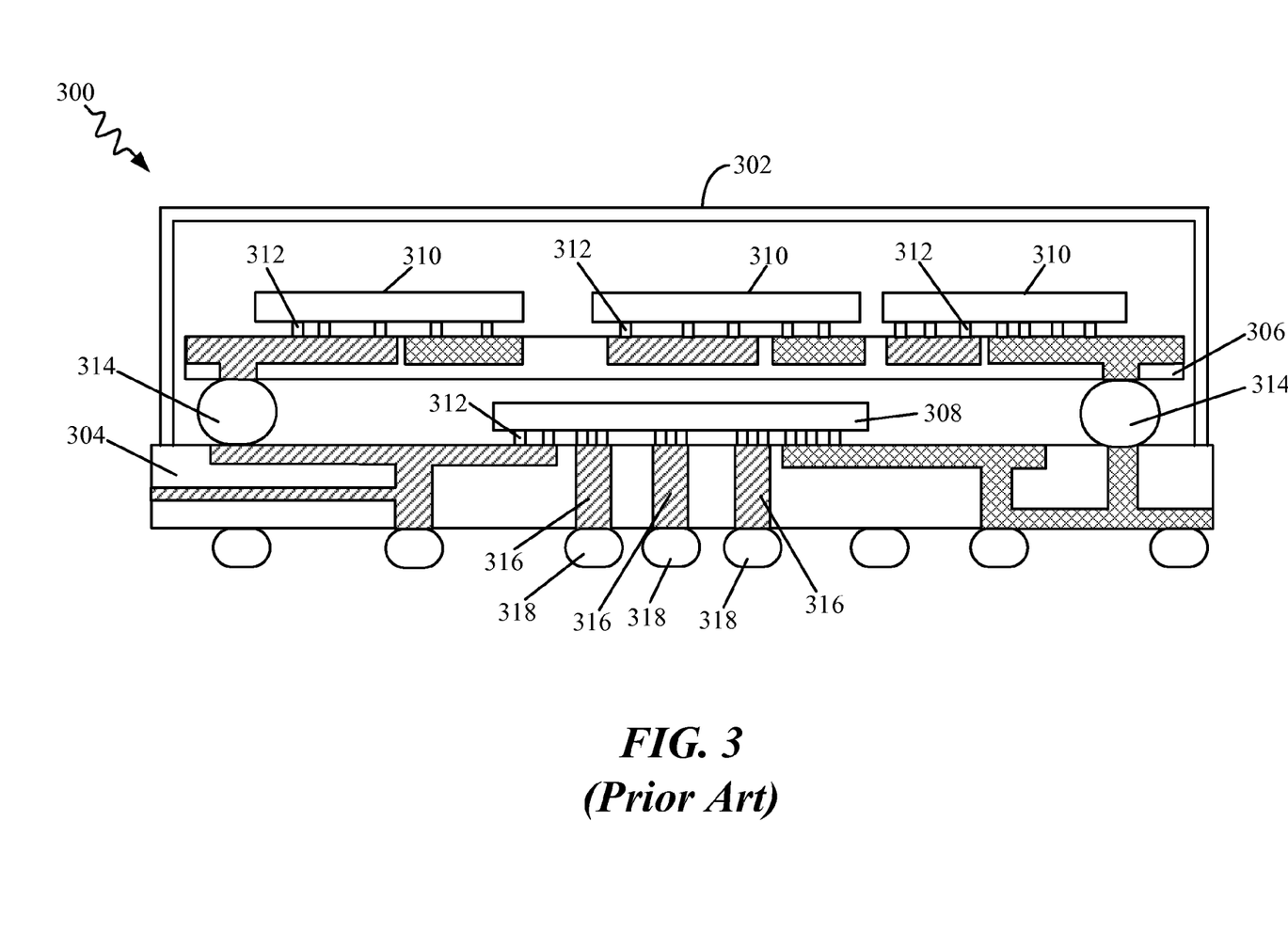
FIG. 3 illustrates a schematic block diagram of a PoP circuit found in the prior art that is covered with an EMI shield.

FIG. 3 illustrates a schematic block diagram of a PoP circuit 300 found in the prior art that is covered with an EMI shield 302. The PoP circuit 300 includes a first package substrate 304 and a second package substrate 306. The second package substrate 306 is stacked on top of the first package substrate 304. The first substrate 304 may include at least one integrated circuit (IC), such as an RF power amplifier IC 308. The second substrate 306 may include a plurality if ICs 310, such as one or more passive duplexers and/or filters (e.g., surface acoustic wave (SAW) filters). The ICs 308, 310 are each electrically and physically coupled to their respective substrates 304, 306 through a plurality of soldering bumps 312. The second substrate 306 is electrically and physically coupled to the first substrate 304 through one or more soldering balls 314 or conductive pillars.

The PoP circuit 300 has a couple significant disadvantages. First, the plurality of ICs 310 coupled to the second substrate 306 have poor thermal conductive paths, which cause the heat generated by the ICs 310 to build up in the PoP circuit 300 and degrade performance. For example, a majority of the heat generated by the second substrate's ICs 310 are dissipated only through the soldering balls/pillars 314, which are located near the edges of the second substrate 306 and are relatively few in number. Thus, even though the second substrate's ICs 310 may be passive ICs (e.g., passive filters) that generate a fraction (e.g., ⅛th) of the heat of the high power, active RF power amplifier IC 308, the poor thermal conductive paths 314 coupled to the second substrate's ICs 310 causes these ICs 310 to reach undesirably high temperatures. By contrast, the first substrate's IC 308 has relatively good thermal conductive paths that allow the relatively high amounts of heat energy generated by the RF power amplifier 308 to be dissipated away. These thermal conductive paths include thermal vias 316 located within the first substrate 304 that electrically and thermally couple the RF power amplifier 308 to soldering balls 318 and/or heat spreaders that help dissipate heat.

Second, the location and limited number of soldering balls 314 that electrically couple the second substrate's ICs 310 to the first substrate 304 (e.g., ground and power nets) also limit the electrical performance of the PoP circuit 300. The soldering balls 314 cause a bottleneck that particularly increases the parasitic inductance between the second substrate's ICs 310 and the ground/power nets. This inductance reduces the electrical performance of the ICs 310 (e.g., SAW filters).

The EMI shield 302 is made of metal and is designed in such a way to act as a Faraday cage that fits over the plurality of RF devices 308, 310. Although the EMI shield 302 prevents a substantial amount of undesirable RF radiation to leak out from or into the PoP circuit, it does nothing to alleviate the two aforementioned problems above. Thus, there exists a need for improved package-on-package designs featuring EMI shields that—in addition to providing protection for RF radiation—help improve the thermal and electrical performance of underlying integrated circuits within the package-on-package devices.

SUMMARY

One feature provides a package comprising a substrate having at least one first circuit component coupled to a first surface of the substrate, and an electromagnetic interference (EMI) shield coupled to the substrate, the EMI shield including a metal casing configured to shield the package from radio frequency radiation, a dielectric layer coupled to at least a portion of an inner surface of the metal casing, a plurality of signal lines coupled to the dielectric layer and electrically isolated from the metal casing by the dielectric layer, and at least one second circuit component coupled to an inner surface of the EMI shield, at least a portion of the inner surface of the EMI shield facing the first surface of the substrate, and the plurality of signal lines configured to provide electrical signals to the second circuit component. According to one aspect, the metal casing is further configured to provide an electrical ground to the second circuit component. According to another aspect, the second circuit component is further coupled to the inner surface of the metal casing. According to yet another aspect, the metal casing is thermally coupled to the second circuit component and configured to dissipate heat energy generated by the second circuit component. According to another aspect, the first and second circuit components are each at least one of an active and/or a passive RF circuit component.

According to one aspect, the metal casing includes a plurality of side walls that couple the EMI shield to the substrate. According to another aspect, one or more slots are formed between the plurality of side walls that allow air flow through a cavity formed by the metal casing having the plurality of side walls and the substrate. According to yet another aspect, the plurality of side walls include an inner side wall surface that includes the dielectric layer and at least a portion of the plurality of signal lines.

According to one aspect, the inner side wall surface electrically couples the second circuit component to the substrate using the portion of the plurality of signal lines. According to another aspect, the EMI shield and the substrate form a cavity that contains the first and second circuit components. According to yet another aspect, the package is incorporated into at least one of a music player, a video player, an entertainment unit, a navigation device, a communications device, a mobile phone, a smartphone, a personal digital assistant, a fixed location terminal, a tablet computer, and/or a laptop computer.

Another feature provides a method of manufacturing a package where the method comprises providing a substrate and at least one first circuit component, coupling the first circuit component to a first surface of the substrate, providing an electromagnetic interference (EMI) shield having a metal casing configured to shield the package from radio frequency radiation, depositing a dielectric layer over at least a portion of an inner surface of the metal casing, forming a plurality of signal lines at the dielectric layer such that the plurality of signal lines are electrically isolated from the metal casing by the dielectric layer, coupling at least one second circuit component to an inner surface of the EMI shield, the plurality of signal lines configured to provide electrical signals to the second circuit component, and coupling the EMI shield to the substrate such that at least a portion of the inner surface of the EMI shield faces the first surface of the substrate. According to one aspect, the method further comprises coupling the second circuit component to the inner surface of the metal casing. According to another aspect, the method further comprises thermally coupled the metal casing to the second circuit component so that the metal casing is configured to dissipate heat energy generated by the second circuit component.

According to one aspect, the method further comprises forming a cavity between the EMI shield and the substrate that contains the first and second circuit components. According to another aspect, the metal casing includes a plurality of side walls, the method further comprises coupling the plurality of side walls of the EMI shield to the substrate. According to yet another aspect, the method further comprises forming a cavity bounded by the metal casing, the plurality of side walls, and the substrate, and forming one or more slots between the plurality of side walls that allow air flow through the cavity. According to another aspect, the method further comprises electrically coupling the second circuit component to the substrate using the portion of the plurality of signal lines that are included on the inner side wall surface.

Another feature provides a package that comprises a substrate having at least one first circuit component coupled to a first surface of the substrate, and a means for covering at least a portion of the substrate, the means for covering including a means for shielding the package from radio frequency radiation, a means for insulating coupled to at least a portion of an inner surface of the means for shielding, a plurality of means for carrying electrical signals coupled to the means for insulating and electrically isolated from the means for shielding by the means for insulating, and at least one second circuit component coupled to an inner surface of the means for covering, at least a portion of the inner surface of the means for covering facing the first surface of the substrate, and the plurality of means for carrying electrical signals configured to provide electrical signals to the second circuit component. According to one aspect, the means for shielding is further configured to provide an electrical ground to the second circuit component. According to another aspect, the second circuit component is further coupled to the inner surface of the means for shielding.

According to one aspect, the means for shielding is thermally coupled to the second circuit component and configured to dissipate heat energy generated by the second circuit component. According to another aspect, the means for shielding includes a plurality of side walls that couple the means for covering to the substrate. According to yet another aspect, one or more means for ventilation are formed between the plurality of side walls that allow air flow through a cavity formed by the means for shielding having the plurality of side walls and the substrate.

According to one aspect, the plurality of side walls include an inner side wall surface that includes the means for insulating and at least a portion of the plurality of means for carrying electric signals. According to another aspect, the inner side wall surface electrically couples the second circuit component to the substrate using the portion of the plurality of means for carrying electric signals. According to yet another aspect, the means for covering and the substrate form a cavity that contains the first and second circuit components.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The word "exemplary" is used herein to mean "serving as an example, instance, or illustration." Any implementation or aspect described herein as "exemplary" is not necessarily to be construed as preferred or advantageous over other aspects of the disclosure.

Overview

One implementation provides a multi-chip package that includes a substrate and an electromagnetic interference (EMI) shield coupled to the substrate. At least one integrated circuit is coupled to a first surface of the substrate. The EMI shield includes a metal casing configured to shield the package from radio frequency radiation, a dielectric layer coupled to at least a portion of an inner surface of the metal casing, and a plurality of signal lines. The signal lines are coupled to the dielectric layer and electrically isolated from the metal casing by the dielectric layer. At least one other integrated circuit is coupled to an inner surface of the EMI shield, and at least a portion of the inner surface of the EMI shield faces the first surface of the substrate. The signal lines are configured to provide electrical signals to the second circuit component.

Exemplary EMI Shield

Figure 4:
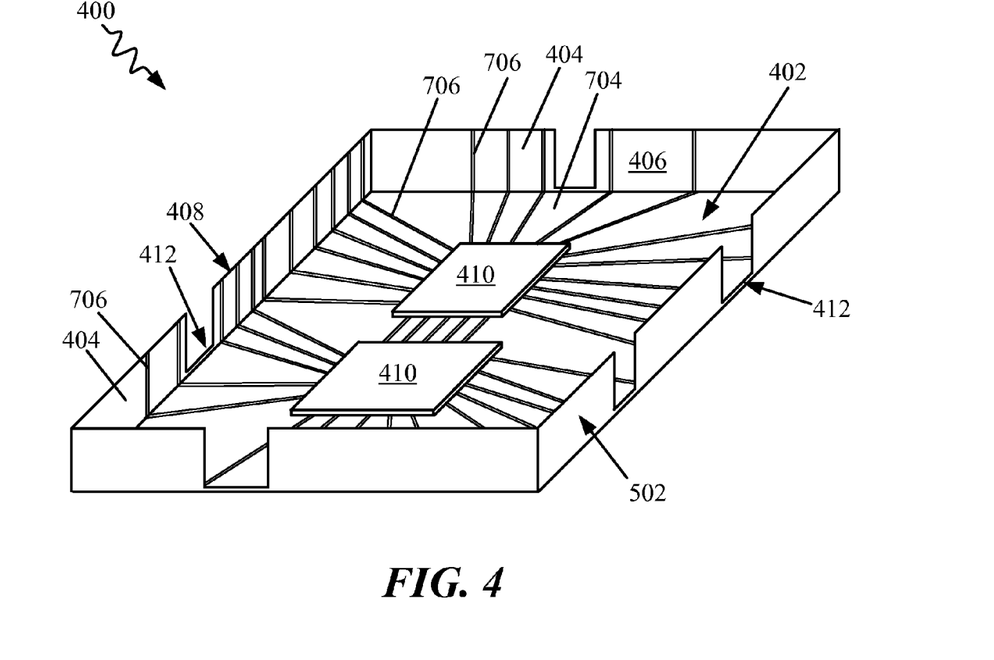
FIG. 4 illustrates a bottom perspective view of the EMI shield.
Figure 5:
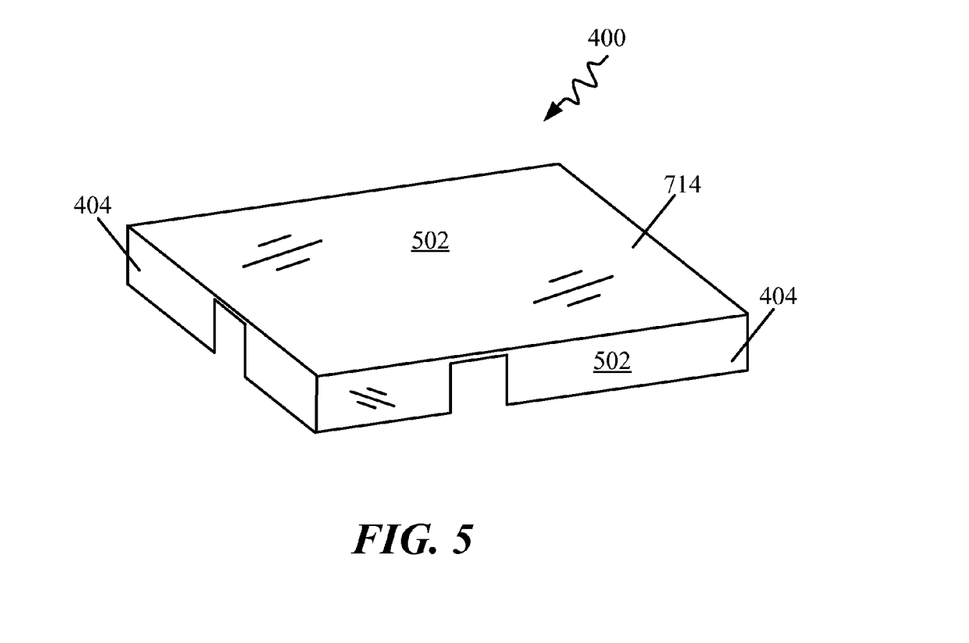
FIG. 5 illustrates a top perspective view of the shield.
Figure 6:
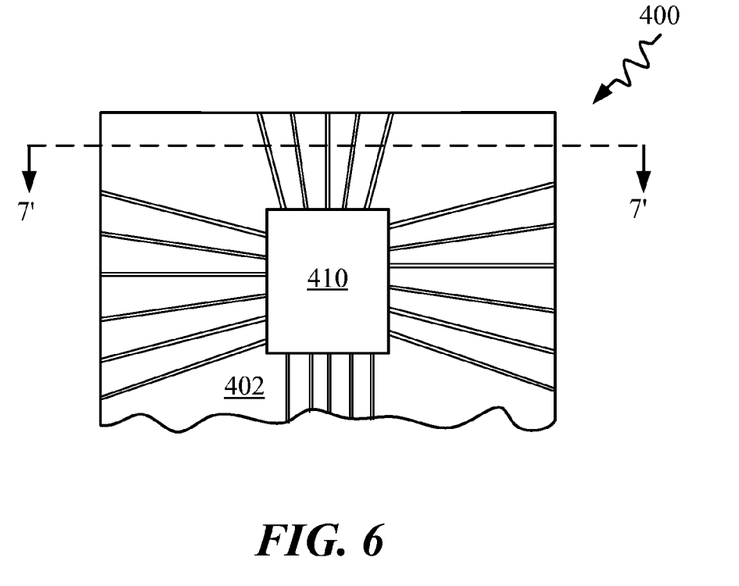
FIG. 6 illustrates a top view of a portion of the shield.
Figure 7:
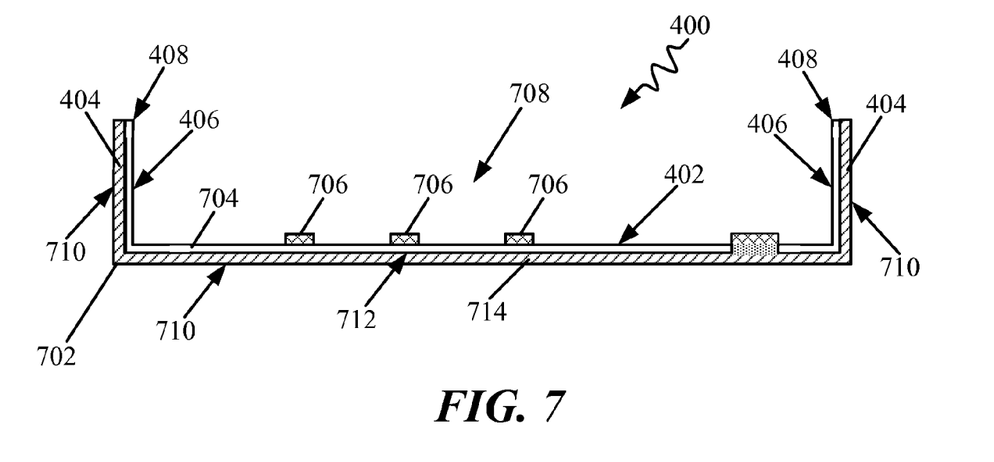
FIG. 7 illustrates a cross-sectional view of the EMI shield.

FIGS. 4-7 illustrate various views of an EMI shield 400 according to one aspect of the disclosure. Specifically, FIG. 4 illustrates a bottom perspective view of the EMI shield 400, and FIG. 5 illustrates a top perspective view of the shield 400. FIG. 6 illustrates a top view of a portion of the shield 400, and FIG. 7 illustrates a cross-sectional view of the EMI shield 400 taken along the line 7'-7'. As will be described in greater detail below, the EMI shield 400 provides a thermally conductive path to dissipate heat away from circuit components coupled to it. It also serves to reduce parasitic inductance and resistance and thus improves electrical performance of the circuit components coupled to it.

Referring to FIGS. 4, 5, and 6, the EMI shield 400 includes an inner surface 402 and an outer surface 502. One or more circuit components 410 (e.g., second circuit components) may be coupled and/or mounted onto the inner surface 402 of the EMI shield 400. These circuit components 410 may include passive and/or active circuit components, such as passive and/or active RF circuit components. Examples of such components include, but are not limited to, resistors, capacitors, inductors, passive RF filters, active RF filters, surface acoustic wave (SAW) filters, processing circuits, RF amplifier circuits, duplexers, up-converters, down-converters, etc. According to one aspect, the circuit components 410 may be coupled to the inner surface 402 of the EMI shield 400 in a flip chip fashion using a ball grid array (BGA).

FIG. 7 illustrates a cross sectional view of the EMI shield 400 taken along the line 7'-7'. In the illustrated example, the shield 400 comprises a metal casing 702, a dielectric layer 704, and a plurality of signal lines 706. The metal casing 702 may be composed of a metal or metal alloy, such as, but not limited to, aluminum, copper, gold, palladium, zinc, etc. The metal casing 702 is adapted to shield the circuit components within a cavity 708 of the EMI shield 400 from RF radiation. According to one aspect, the outer metal surface 710 of the metal casing 702 is the outer surface 502 (see FIG. 5) of the EMI shield 400. Referring to FIG. 7, the metal casing 702 also includes an inner metal surface 712 that is within the cavity 708 of the EMI shield 400.

The dielectric layer 704 is made of one or more materials that are substantially electrical insulators. The dielectric layer 704 is coupled to the inner metal surface 712 of the metal casing 702. The plurality of signal lines 706 are coupled to the dielectric layer 704 and are electrically isolated from the metal casing 702 by the dielectric layer 704. The signal lines 706 are electrical conductors that provide electrical signals to the one or more circuit components 410 (see FIGS. 4 and 6) coupled to the EMI shield 400. The dielectric layer 704 may be a means for insulating, and the signal lines 706 may be a means for carrying an electrical signal.

Referring to FIGS. 4 and 7, the metal casing 702 includes a back plate 714 and a plurality of side walls 404. The side walls 404 include an inner side wall surface 406 that includes the dielectric layer 704 and also a portion of the plurality of signal lines 706. The portion of the plurality of signal lines 706 continue to extend alongside the inner side wall surfaces 406. According to one aspect, the plurality of signal lines 706 may extend up to the edges 408 of the side walls 404. The inner side wall surfaces 406 electrically couple the circuit components 410 to a module substrate (shown in FIG. 8) using the portion of the plurality of signal lines 706. The side walls 404 further include slots 412 that provide airflow through the cavity 708. The slots 412 also allow for molding compound (not shown) to be injected into the cavity 708. The slots may be means for ventilation.

Exemplary Module Substrate

Figure 8:
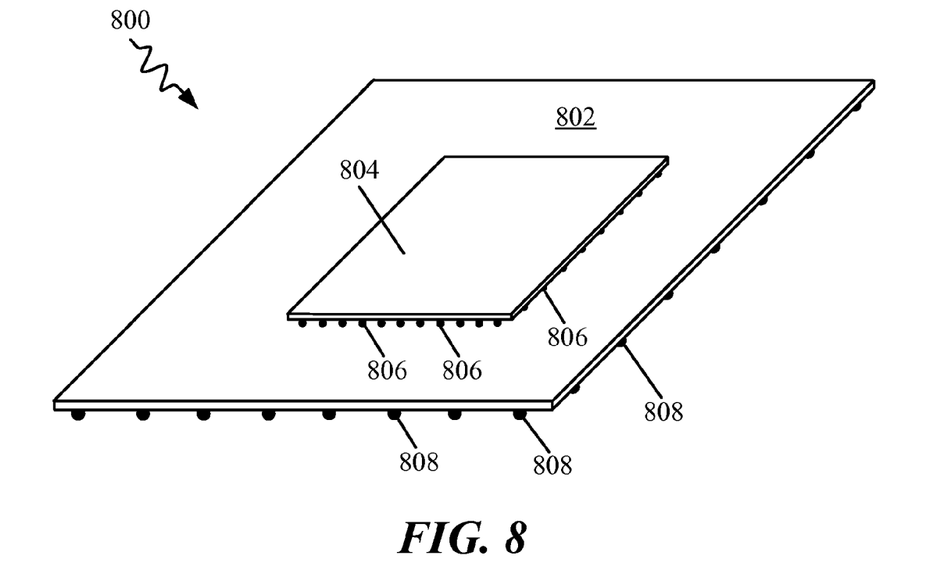
FIG. 8 illustrates a module substrate (e.g., a first substrate).

FIG. 8 illustrates a module substrate 800 (e.g., a first substrate) according to one aspect of the disclosure. The module substrate 800 may be a multi-layer laminate substrate having a first surface 802. One or more circuit components 804 (e.g., first circuit components) may be coupled to the first surface 802 of the module substrate 800. These circuit components may include, but are not limited to, resistors, capacitors, inductors, passive RF filters, active RF filters, surface acoustic wave (SAW) filters, processing circuits, RF amplifier circuits, duplexers, up-converters, down-converters, etc. According to one aspect, the circuit components 804 may be coupled to the first surface 802 of the module substrate 800 in a flip chip BGA fashion (e.g., using soldering bumps 806). In other aspects, the circuit components 804 may be coupled using wire bonding. The module substrate 800 may also have a second surface that is opposite the first surface 802. According to one example, the second surface may have a plurality of soldering balls 808 coupled thereto that bond to corresponding electrical contact points on a printed circuit board (not shown). According to another example, instead of soldering balls 808 the second surface may have metal pads that are planar in shape. The planar metal pads couple to corresponding metal land pads located on a printed circuit board (not shown). An electrically and thermally conductive paste may be also applied between the planar metal pads and the metal land pads to maximize heat dissipation.

Exemplary Multi-Chip Package Featuring EMI Shield

Figure 9:
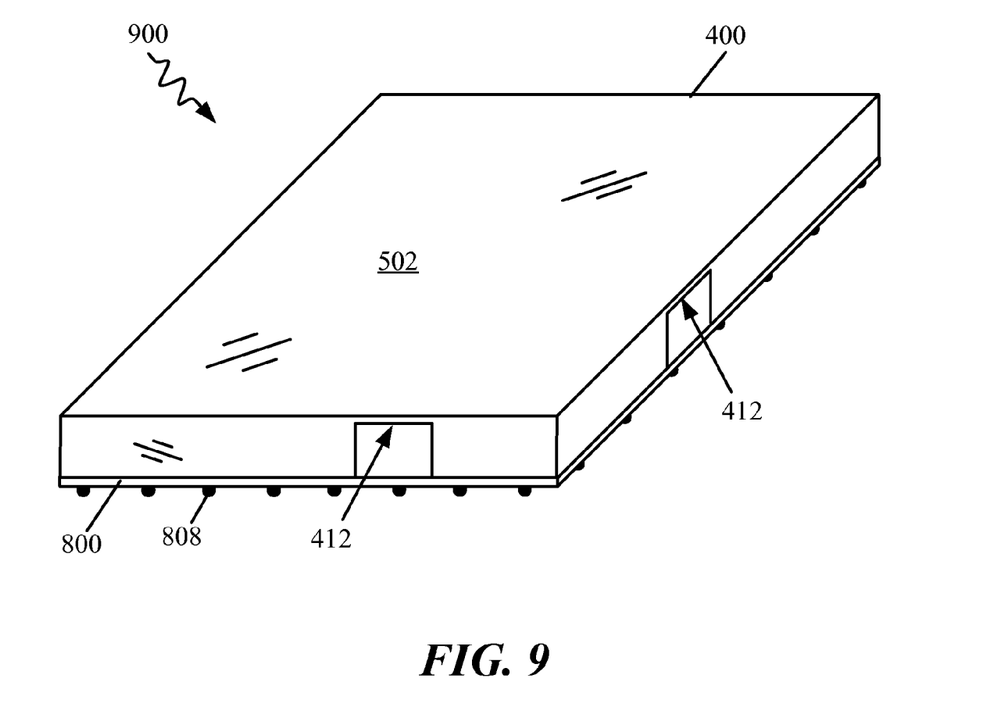
FIG. 9 illustrates a multi-chip package.

FIG. 9 illustrates a multi-chip package (MCP) 900 according to one aspect of the disclosure. Notably, the MCP 900 comprises the EMI shield 400 and the module substrate 800. Specifically, the MCP 900 is formed by coupling the EMI shield 400 to the module substrate 800 such that the inner surface 402 of the EMI shield 400 faces the first surface 802 of the module substrate (see FIGS. 4, 8, and 9). Referring to FIGS. 7 and 9, the cavity 708 may be formed by the combination of the module substrate 800, and the EMI shield 400, and more specifically, by the module substrate 800, and the metal casing's side walls 404 and back plate 714. The EMI shield 400 may be a means for covering the module substrate 800, and the metal casing 702 (see FIG. 7) may be a means for shielding the multi-chip package 900 from RF radiation.

Figure 10:
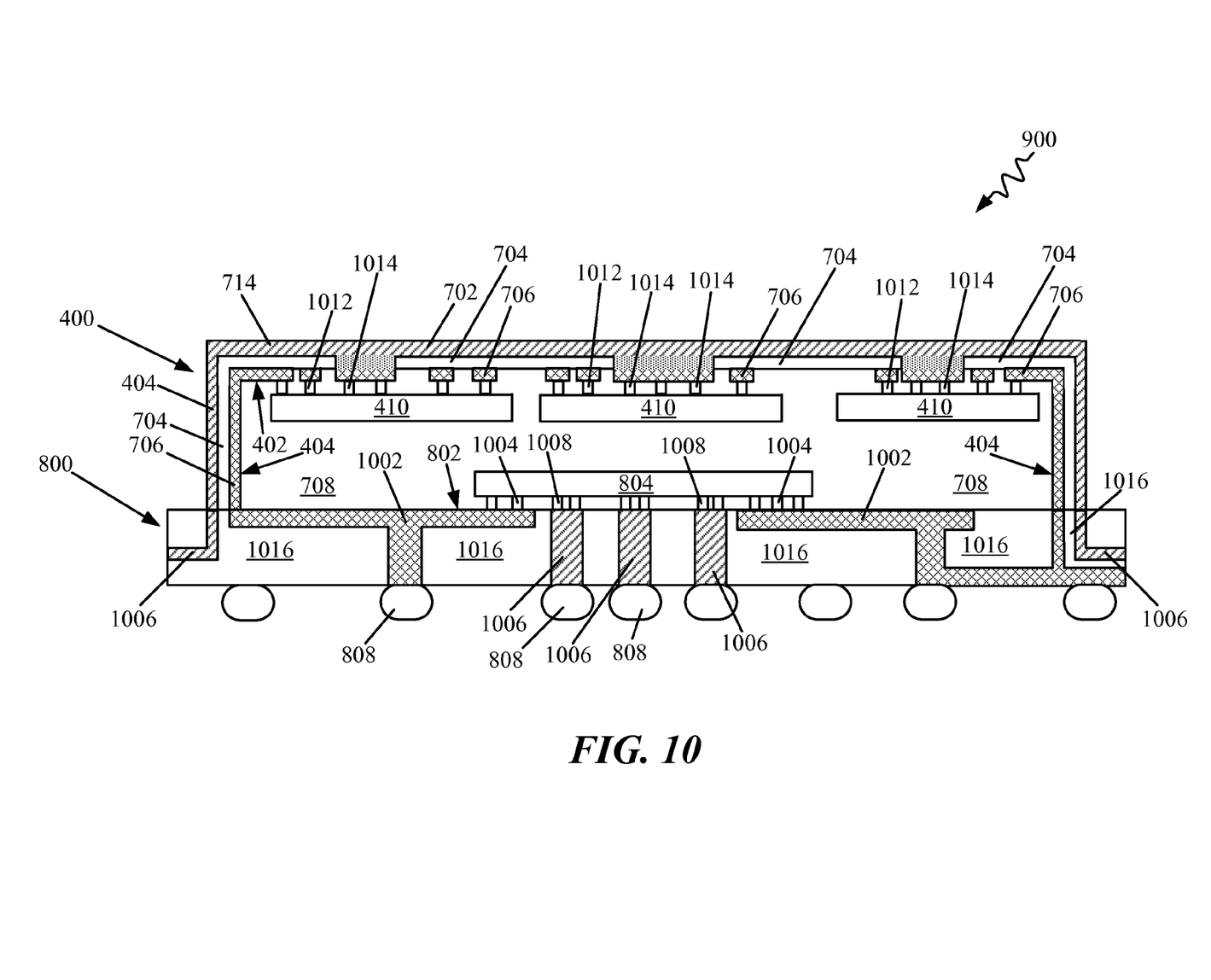
FIG. 10 illustrates a cross sectional, schematic block diagram of the multi-chip package.

FIG. 10 illustrates a cross sectional, schematic block diagram of the multi-chip package (MCP) 900 according to one aspect of the disclosure. As described above, the MCP 900 includes the EMI shield 400 and the module substrate 800. The module substrate 800 includes a first circuit component 804 that is coupled to the first surface 802 of the module substrate 800. The first circuit component 804 may be, for example, an RF signal amplifier circuit. The first circuit component 804 may be electrically coupled to signal lines 1002 located on the module substrate 800 through a plurality of electrical connections 1004 (e.g., soldering bumps). Similarly, the first circuit component 804 may be electrically coupled to signal ground 1006 located on the module substrate 800 through a plurality of other electrical connections 1008 (e.g., soldering bumps). The signal ground 1006 may also be coupled to soldering balls 808 that are electrically and thermally coupled to corresponding metal contact points on a printed circuit board (not shown), which helps dissipate heat generated by the first circuit component 804. According to one example, instead of soldering balls 808 the signal ground 1006 may be coupled to metal pads that are planar in shape. The planar metal pads couple to corresponding metal land pads located on a printed circuit board (not shown). An electrically and thermally conductive paste may be also applied between the planar metal pads and the metal land pads to maximize heat dissipation of the first circuit component 804.

The EMI shield 400 includes the metal casing 702, the dielectric layer 704, and the plurality of signal lines 706. The EMI shield 400 also includes one or more second circuit components 410 (e.g., RF filters, duplexers, etc.) that are coupled to the inner surface 402 of the EMI shield 400. The second circuit components 410 may be electrically coupled to the plurality of signal lines 706 located on the EMI shield 400 through a plurality of electrical connections 1012 (e.g., soldering bumps). Similarly, the second circuit components 410 may be electrically coupled to the metal casing 702 through a plurality of electrical connections 1014 (e.g., soldering bumps). The plurality of signal lines 706 are electrically isolated from the metal casing 702 by the dielectric layer 704.

The EMI shield 400 and/or the metal casing 702 also includes the side walls 404 that electrically and physically couple the EMI shield 400 to the module substrate 800. Specifically, the metal casing's side walls 404 are electrically coupled to signal ground 1002 of the module substrate 800, and thus the entire metal casing 702 acts as a signal ground for second circuit components 410. Since the second circuit components 410 are coupled to the metal casing 702 at a multitude of locations through the electrical connections 1014, the metal casing 702 provides a strong electrical ground contact surface for the second circuit components 410, which lowers parasitic inductance and resistance associated with the second circuit components 410. Moreover, like a heat spreader, the metal casing 702 absorbs and dissipates heat energy generated by the second circuit components due to the direct, thermally-conductive physical contact between the second circuit components 410 and the metal casing 702.

The side walls 404 further electrically and physically couple the EMI shield 400 to the module substrate 800 because the portion of the plurality of signal lines 706 that run alongside the inner side wall surfaces 404 are electrically coupled to the signal lines 1002 of the module substrate 800. The dielectric layer 704 of the EMI shield 400 may couple to an insulating material 1016 of the module substrate 800.

Exemplary Methods

FIGS. 11-15 illustrate a manufacturing process flow of the EMI shield 400 according to one aspect.

Figure 11:
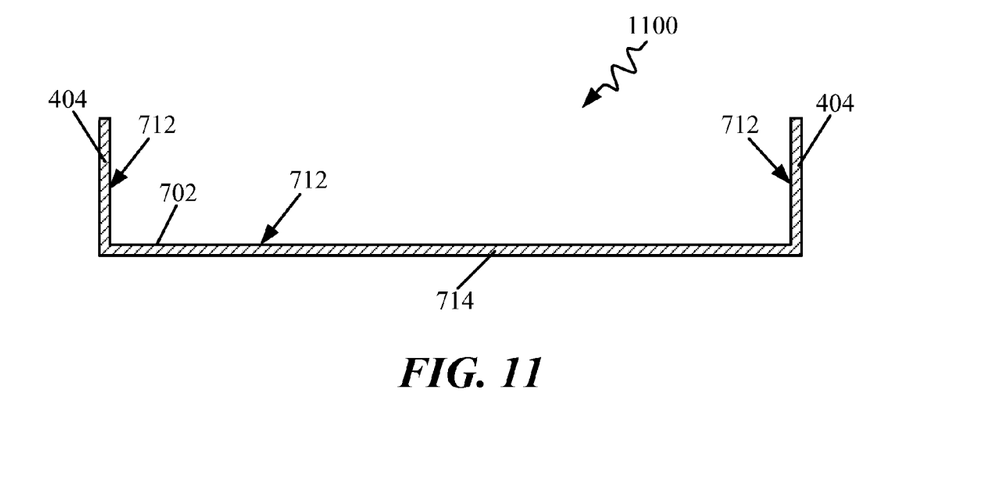
FIGS. 11-15 illustrates a manufacturing process flow of the EMI shield.

FIG. 11 illustrates a first step 1100 where the metal casing 702 is provided. As described above the metal casing 702 acts as the outer metal layer and electrical ground for the EMI shield 400. It includes the side walls 404, back plate 714, and an inner metal surface 712.

Figure 12:
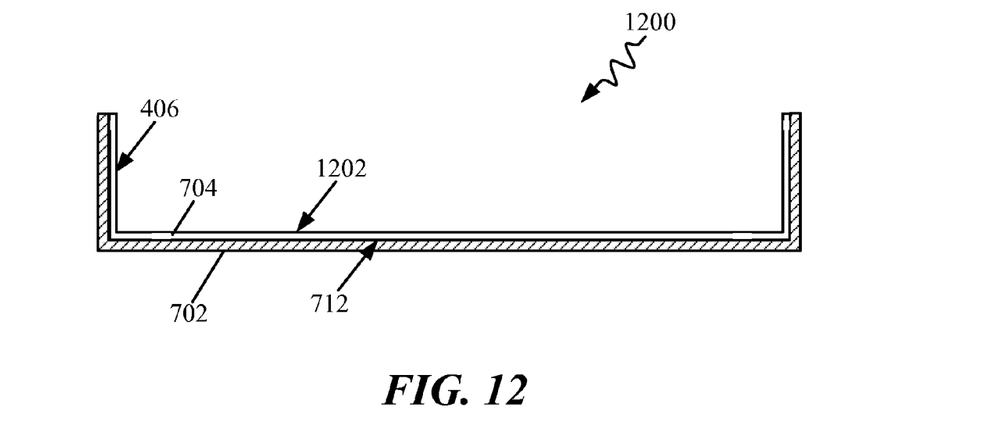

FIG. 12 illustrates a second step 1200 where the dielectric layer 704 is deposited onto the inner metal surface 712 of the metal casing 702. The dielectric layer 704 is made of an insulating material. The dielectric layer 704 has an inner dielectric surface 1202 and inner side wall surfaces 406.

Figure 13:
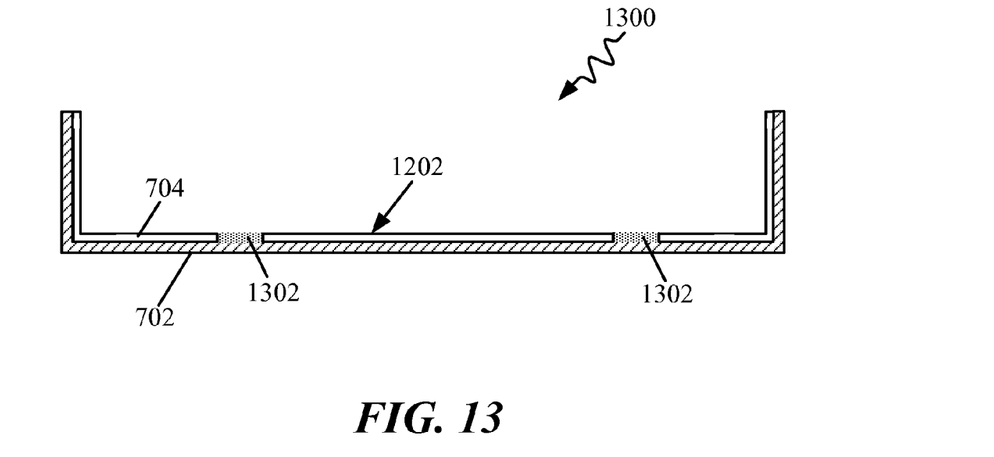

FIG. 13 illustrates a third step 1300 where portions of the dielectric layer 704 are removed (e.g., etched away) and vertical interconnect accesses (vias) 1302 are formed by filling in the space that remains. The vias 1302 are made of an electrically and thermally conductive material such as copper, aluminum, etc. The vias 1302 are thus electrically grounded.

Figure 14:
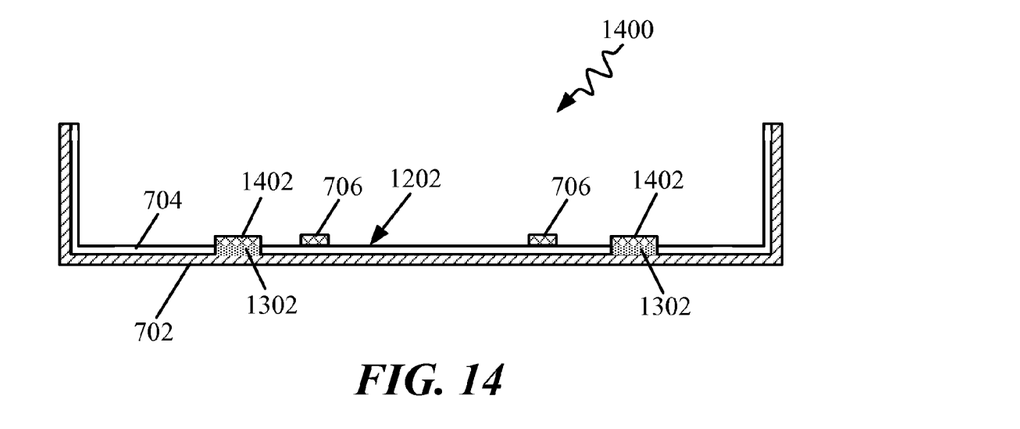

FIG. 14 illustrates a fourth step 1400 where signal lines 706 are formed on top of and/or within the dielectric layer 704 and ground lines 1402 are formed over the vias 1302. The ground lines 1402 and signal lines 706 are made of an electrically conductive material such as metal including, but not limited to, aluminum, copper, gold, etc. Since the ground lines 1402 are coupled to the vias 1302 they too are electrically grounded. By contrast, the signal lines 706 are electrically and physically isolated from the grounded metal casing 702 and carry signals (e.g., RF signals).

Figure 15:
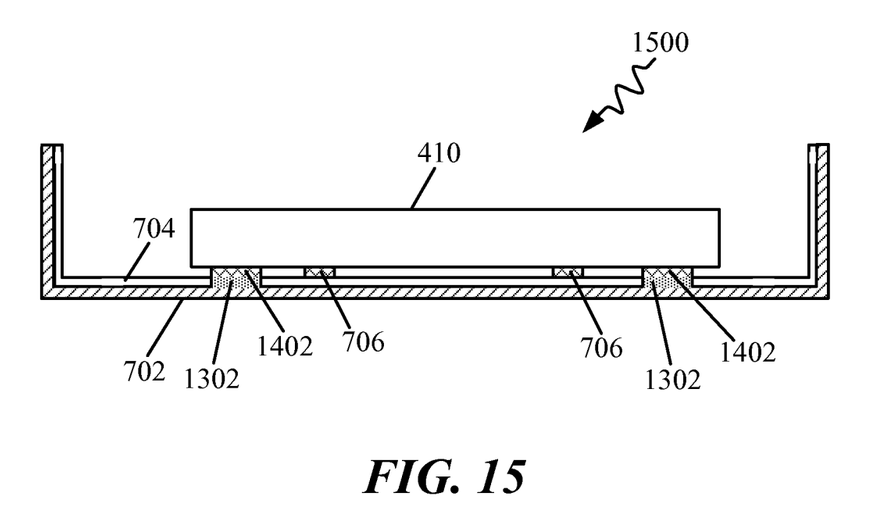

FIG. 15 illustrates a fifth step 1500 where a circuit component 410, such as an RF IC (e.g., filter, duplexer, amplifier, etc.) is physically, electrically, and thermally coupled to the ground lines 1402 and signal lines 706. According to one example, soldering bumps 1012, 1014 (see FIG. 10) may be used to couple the component 410 to the ground and signal lines 1402, 706. The signal lines 706 provide the electrical RF signals to the circuit component 410 while the ground lines 1402 provide an electrical ground to the component 410. Notably, the circuit component 410 may dissipate heat through the ground lines 1402, vias 1302, and metal casing 702.

The steps 1100, 1200, 1300, 1400, 1500 above with respect to FIGS. 11-15 describe and illustrate just one general method of manufacturing the EMI shield 400. In practice the EMI shield 400 may be manufactured using a variety of sub-steps and sub-processes related to steps 1100, 1200, 1300, 1400, and/or 1500. For example, performing one or more of these steps 1100, 1200, 1300, 1400, 1500 may include one or more of the following processes (not listed in any particular order): ground line and/or signal line etching; via plating; seed layer deposition; photoresist deposition; metal layer deposition; photoresist removal; seed layer removal; seed layer etching; and/or dielectric layer etching. For example, the steps 1300, 1400 of FIGS. 13 and 14 may be performed by: etching away portions of the dielectric layer 704 to form via holes; plating the via holes; depositing a seed layer over the dielectric layer 704 and/or plated vias; applying a mask and photoresist to define signal lines and ground lines; depositing a metal layer (e.g., plating); removing the photoresist layer; and etching away the seed layer.

According to one aspect, ground lines may be formed independent to and before the signal lines are formed. According to another aspect, signal lines may be formed independent to and before the ground lines are formed. For example, according to one aspect, after the dielectric layer 704 is deposited onto the inner metal surface 1202 and inner side wall surfaces 406 of the metal casing 702, a mask and photoresist process may be applied to selectively etch away portions of the dielectric layer 704 to expose the inner metal surface 1202 of the metal casing 702. The exposed inner metal surface 1202 portions will serve as ground lines. Then, a seed layer may be deposited for signal line deposition followed by a signal line metal layer deposition step. Next, portions of the seed layer may be etched away.

As another example, after the dielectric layer 704 is deposited onto the inner metal surface 1202 and inner side wall surfaces 406 of the metal casing 702, a seed layer may be deposited for signal line deposition. Then, a mask and photoresist process may be applied to define signal lines followed by a signal line metal layer deposition. Next, portions of the seed layer may be etched away. Then, another mask and photoresist process may be applied to define ground lines. Next, portions of the dielectric layer 704 where the ground lines are to be are etched away to expose the inner metal surface 1202 of the metal casing 702, which will serve as ground.

Figure 16:
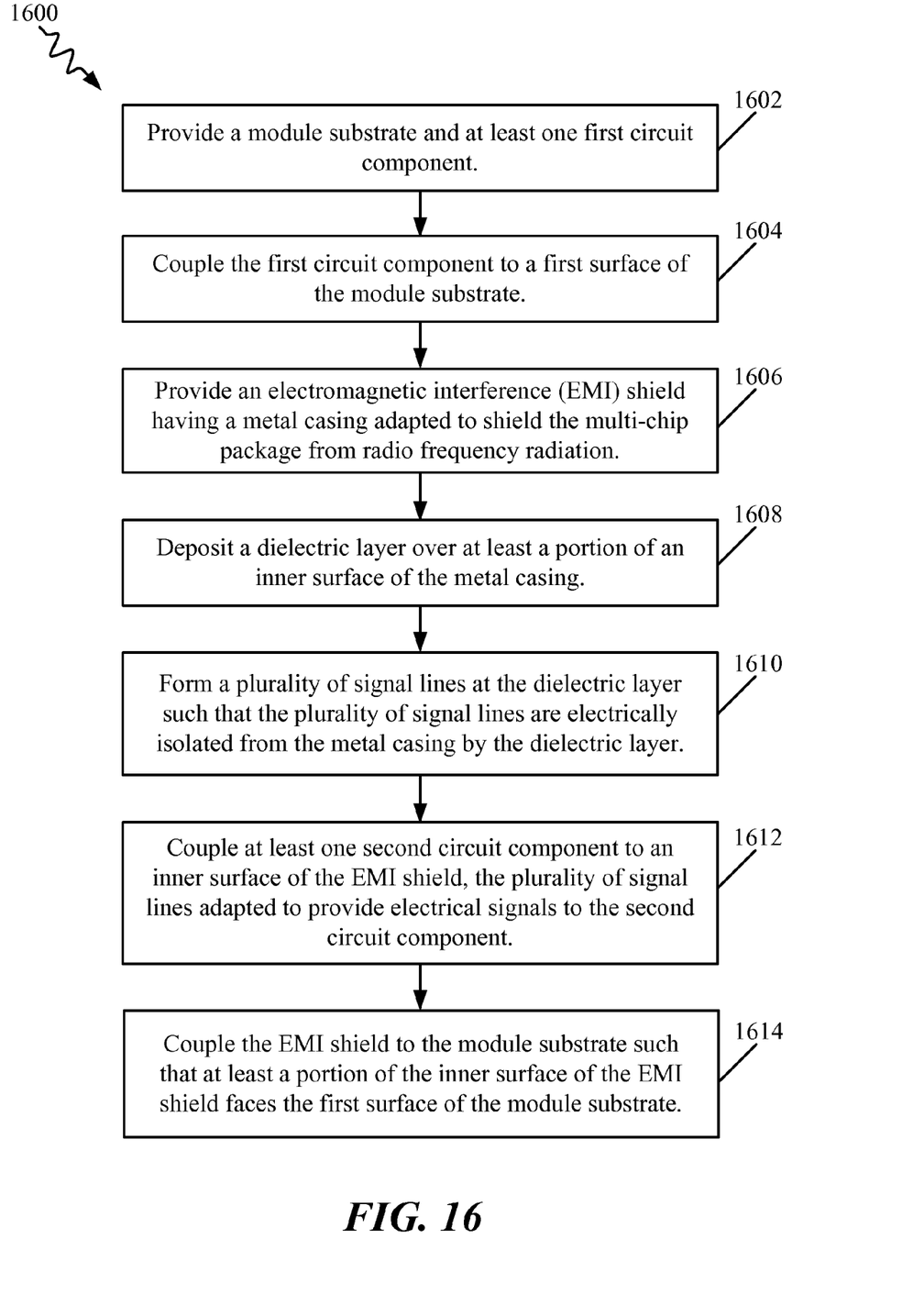
FIG. 16 illustrates a flow diagram of a method for manufacturing a multi-chip package.

FIG. 16 illustrates a flow diagram 1600 of a method for manufacturing a multi-chip package according to one aspect of the disclosure. First, a module substrate and at least one first circuit component is provided 1602. Next, the first circuit component is coupled to a first surface of the module substrate 1604. Then, an electromagnetic interference (EMI) shield having a metal casing adapted to shield the multi-chip package from radio frequency radiation is provided 1606. Next, a dielectric layer is deposited over at least a portion of an inner surface of the metal casing 1608. Then, a plurality of signal lines are formed at the dielectric layer such that the plurality of signal lines are electrically isolated from the metal casing by the dielectric layer 1610. Next, at least one second circuit component is coupled to an inner surface of the EMI shield, where the plurality of signal lines are adapted to provide electrical signals to the second circuit component 1612. Finally, the EMI shield is coupled to the module substrate such that at least a portion of the inner surface of the EMI shield faces the first surface of the module substrate 1614.

Exemplary Devices

Figure 17:
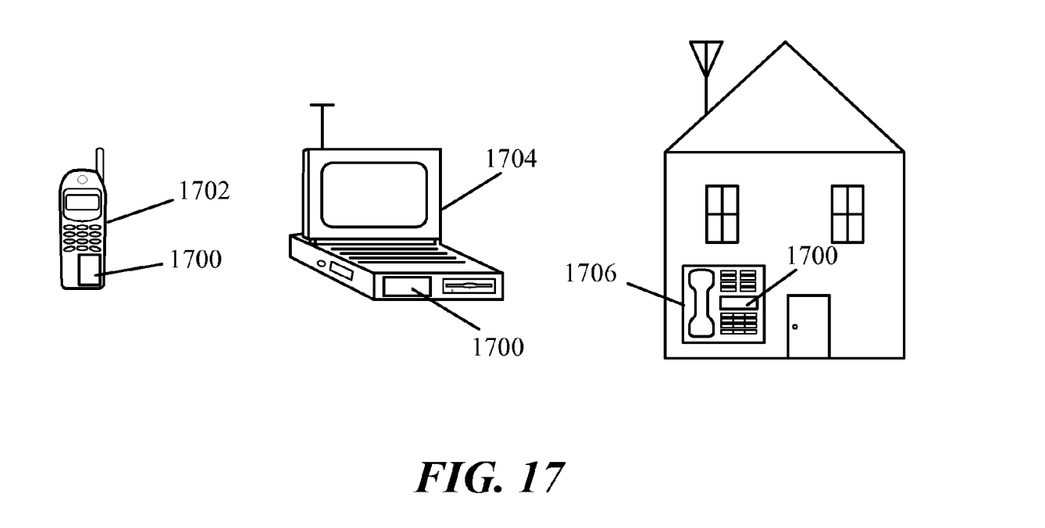
FIG. 17 illustrates various electronic devices that may be integrated with the multi-chip package.

FIG. 17 illustrates various electronic devices that may be integrated with the aforementioned MCP 900. For example, a mobile telephone 1702, a laptop computer 1704, and a fixed location terminal 1706 may include the MCP 900 featuring the EMI shield 400. The devices 1702, 1704, 1706 illustrated in FIG. 17 are merely exemplary. Other electronic devices may also feature the MCP 900 including, but not limited to, hand-held personal communication systems (PCS) units, portable data units such as personal data assistants, GPS enabled devices, navigation devices, set top boxes, music players, video players, entertainment units, fixed location data units such as meter reading equipment, or any other device that stores or retrieves data or computer instructions, or any combination thereof.

One or more of the components, steps, features, and/or functions illustrated in FIGS. 4, 5, 6, 7, 8, 9, 10, 11, 12, 13, 14, 15, 16, and/or 17 may be rearranged and/or combined into a single component, step, feature or function or embodied in several components, steps, or functions. Additional elements, components, steps, and/or functions may also be added without departing from the invention. The apparatus, devices, and/or components illustrated in FIGS. 4, 5, 6, 7, 8, 9, 10, 11, 12, 13, 14, 15, and/or 17 may be configured to perform one or more of the methods, features, or steps described in FIG. 16.

Also, it is noted that the aspects of the present disclosure may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A package, comprising:
    a substrate having at least one first circuit component coupled to a first surface of the substrate; and
    an electromagnetic interference (EMI) shield coupled to the substrate, the EMI shield including
        a metal casing configured to shield the package from radio frequency radiation,
        a dielectric layer coupled to at least a portion of an inner surface of the metal casing,
        a plurality of signal lines coupled to the dielectric layer and electrically isolated from the metal casing by the dielectric layer,
        a plurality of side walls coupled to the metal casing that include an inner side wall surface that includes the dielectric layer and at least a portion of the plurality of signal lines; and
    at least one second circuit component coupled to an inner surface of the EMI shield, at least a portion of the inner surface of the EMI shield facing the first surface of the substrate, and the plurality of signal lines configured to provide electrical signals to the second circuit component.

2. The package of claim 1, wherein the metal casing is further configured to provide an electrical ground to the second circuit component.

3. The package of claim 2, wherein the second circuit component is further coupled to the inner surface of the metal casing.

4. The package of claim 1, wherein the metal casing is thermally coupled to the second circuit component and configured to dissipate heat energy generated by the second circuit component.

5. The package of claim 1, wherein the first and second circuit components are each at least one of an active and/or a passive RF circuit component.

6. The package of claim 1, wherein one or more slots are formed between the plurality of side walls that allow air flow through a cavity formed by the metal casing having the plurality of side walls and the substrate.

7. The package of claim 1, wherein the inner side wall surface electrically couples the second circuit component to the substrate using the portion of the plurality of signal lines.

8. The package of claim 1, wherein the EMI shield and the substrate form a cavity that contains the first and second circuit components.

9. The package of claim 1, wherein the package is incorporated into at least one of a music player, a video player, an entertainment unit, a navigation device, a communications device, a mobile phone, a smartphone, a personal digital assistant, a fixed location terminal, a tablet computer, and/or a laptop computer.

10. A method of manufacturing a package, the method comprising:
    providing a substrate and at least one first circuit component;
    coupling the first circuit component to a first surface of the substrate;
    providing an electromagnetic interference (EMI) shield having a metal casing configured to shield the package from radio frequency radiation;
    depositing a dielectric layer over at least a portion of an inner surface of the metal casing;
    forming a plurality of signal lines at the dielectric layer such that the plurality of signal lines are electrically isolated from the metal casing by the dielectric layer;
    providing a plurality of side walls coupled to the metal casing that include an inner side wall surface that includes the dielectric layer and at least a portion of the plurality of signal lines;

coupling at least one second circuit component to an inner surface of the EMI shield, the plurality of signal lines configured to provide electrical signals to the second circuit component; and coupling the EMI shield to the substrate such that at least a portion of the inner surface of the EMI shield faces the first surface of the substrate.

11. The method of claim 10, wherein the metal casing is configured to provide an electrical ground to the second circuit component.

12. The method of claim 11, further comprising:
coupling the second circuit component to the inner surface of the metal casing.

13. The method of claim 10, further comprising:
thermally coupling the metal casing to the second circuit component so that the metal casing is configured to dissipate heat energy generated by the second circuit component.

14. The method of claim 10, wherein the first and second circuit components are each at least one of an active and/or a passive RF circuit component.

15. The method of claim 10, further comprising:
forming a cavity between the EMI shield and the substrate that contains the first and second circuit components.

16. The method of claim 10, further comprising:
forming a cavity bounded by the metal casing, the plurality of side walls, and the substrate; and
forming one or more slots between the plurality of side walls that allow air flow through the cavity.

17. The method of claim 10, further comprising:
electrically coupling the second circuit component to the substrate using the portion of the plurality of signal lines that are included on the inner side wall surface.

18. A package, comprising:
a substrate having at least one first circuit component coupled to a first surface of the substrate; and
means for covering at least a portion of the substrate, the means for covering including
means for shielding the package from radio frequency radiation,
means for insulating coupled to at least a portion of an inner surface of the means for shielding,
means for carrying a plurality of electrical signals coupled to the means for insulating and electrically isolated from the means for shielding by the means for insulating,
a plurality of side walls coupled to the means for shielding that include an inner side wall surface that includes the means for insulating and at least a portion of the means for carrying a plurality of electric signals, and
at least one second circuit component coupled to an inner surface of the means for covering, at least a portion of the inner surface of the means for covering facing the first surface of the substrate, and the means for carrying a plurality of electrical signals configured to provide electrical signals to the second circuit component.

19. The package of claim 18, wherein the means for shielding is further configured to provide an electrical ground to the second circuit component.

20. The package of claim 19, wherein the second circuit component is further coupled to the inner surface of the means for shielding.

21. The package of claim 18, wherein the means for shielding is thermally coupled to the second circuit component and configured to dissipate heat energy generated by the second circuit component.

22. The package of claim 18, wherein the first and second circuit components are each at least one of an active and/or a passive RF circuit component.

23. The package of claim 18, wherein one or more means for ventilation are formed between the plurality of side walls that allow air flow through a cavity formed by the means for shielding having the plurality of side walls and the substrate.

24. The package of claim 18, wherein the inner side wall surface electrically couples the second circuit component to the substrate using the portion of the means for carrying a plurality of electric signals.

25. The package of claim 18, wherein the means for covering and the substrate form a cavity that contains the first and second circuit components.

26. The package of claim 18, wherein the package is incorporated into at least one of a music player, a video player, an entertainment unit, a navigation device, a communications device, a mobile phone, a smartphone, a personal digital assistant, a fixed location terminal, a tablet computer, and/or a laptop computer.

* * * * *